(12) United States Patent
Masuda et al.

(10) Patent No.: US 9,362,478 B2
(45) Date of Patent: Jun. 7, 2016

(54) METHOD OF PRODUCING ELECTROMECHANICAL TRANSDUCER ELEMENT, ELECTROMECHANICAL TRANSDUCER ELEMENT, LIQUID DROPLET DISCHARGE HEAD, AND IMAGE FORMING APPARATUS

(71) Applicants: Toshiaki Masuda, Kanagawa (JP); Keishi Miwa, Kanagawa (JP); Keisuke Hayashi, Kanagawa (JP); Takahiko Kuroda, Hyogo (JP)

(72) Inventors: Toshiaki Masuda, Kanagawa (JP); Keishi Miwa, Kanagawa (JP); Keisuke Hayashi, Kanagawa (JP); Takahiko Kuroda, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/572,930

(22) Filed: Dec. 17, 2014

(65) Prior Publication Data

US 2015/0171307 A1    Jun. 18, 2015

(30) Foreign Application Priority Data

Dec. 17, 2013   (JP) ................... 2013-260344

(51) Int. Cl.
| | | |
|---|---|---|
| *B41J 2/015* | (2006.01) | |
| *B41J 2/045* | (2006.01) | |
| *B21D 53/76* | (2006.01) | |
| *B23P 17/00* | (2006.01) | |
| *H01L 41/22* | (2013.01) | |
| *H04R 17/00* | (2006.01) | |
| *H01L 41/053* | (2006.01) | |
| *H01L 41/23* | (2013.01) | |
| *H01L 41/08* | (2006.01) | |
| *H01L 41/09* | (2006.01) | |

(52) U.S. Cl.
CPC ........ *H01L 41/0533* (2013.01); *H01L 41/0805* (2013.01); *H01L 41/0973* (2013.01); *H01L 41/23* (2013.01)

(58) Field of Classification Search
None
See application file for complete search history.

(56) References Cited

U.S. PATENT DOCUMENTS

2007/0278899 A1* 12/2007 Fujii .............................. 310/324
2012/0236083 A1*  9/2012 Mizukami et al. ............. 347/70

FOREIGN PATENT DOCUMENTS

JP          2013-077827         4/2013

* cited by examiner

*Primary Examiner* — Erica Lin
(74) *Attorney, Agent, or Firm* — Oblon, McClelland, Maier & Neustadt, L.L.P

(57) ABSTRACT

A method of producing an electromechanical transducer element includes forming a first, common electrode on one of a substrate and an undercoat layer; forming an electromechanical transducer film on the first electrode; forming a second electrode on the electromechanical transducer film; forming a first protective film on an upper surface of the second electrode, the electromechanical transducer film, and a side wall of the second electrode, and selectively forming a second protective film on a portion of the first protective film protecting the electromechanical transducer film and the side wall of the second electrode.

20 Claims, 10 Drawing Sheets

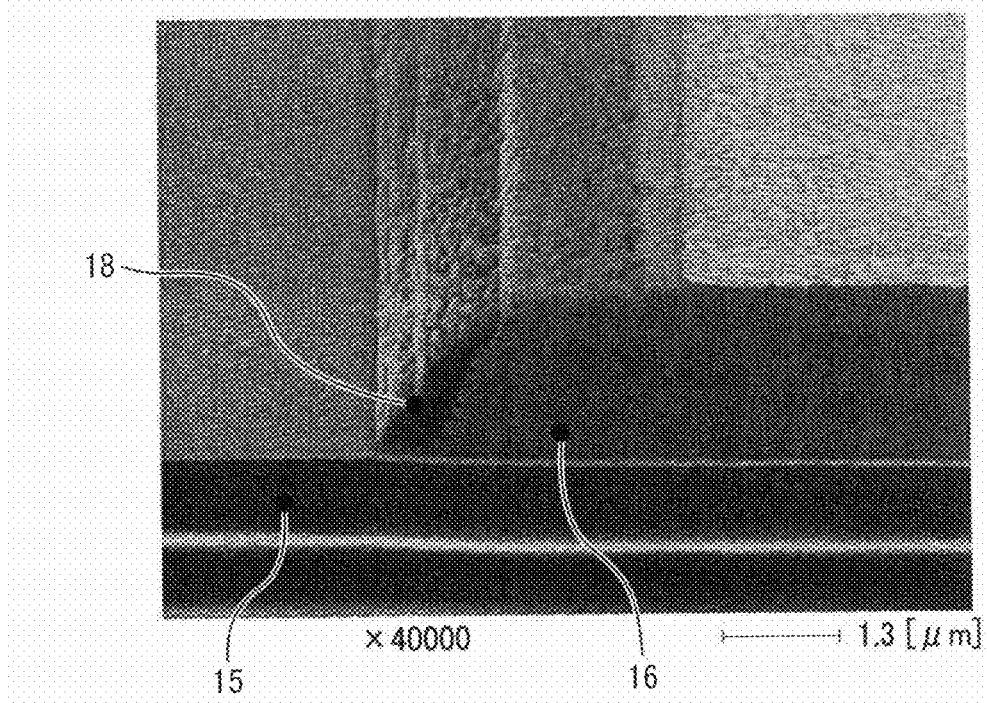

METHOD OF PRODUCING ELECTROMECHANICAL TRANSDUCER ELEMENT, ELECTROMECHANICAL TRANSDUCER ELEMENT, LIQUID DROPLET DISCHARGE HEAD, AND IMAGE FORMING APPARATUS

CROSS-REFERENCE TO RELATED APPLICATIONS

The present application claims priority pursuant to 35 U.S.C. §119(a) from Japanese patent application number 2013-260344, filed on Dec. 17, 2013, the entire disclosure of which is hereby incorporated by reference herein.

BACKGROUND

1. Technical Field

Exemplary embodiments of the present invention relate to a method of producing an electromechanical transducer element, an electromechanical transducer element, a liquid droplet discharge head, and an image forming apparatus.

2. Background Art

Conventionally, an image forming apparatus including a liquid droplet discharge head to discharge liquid ink droplets onto a recording medium to form an image is known. This liquid droplet discharge head includes nozzles to discharge ink droplets, a pressurized chamber communicating with the nozzles, and an actuator as pressure generating means to generate pressure inside the pressurized chamber. (The pressurized chamber may also be referred to as an ink flow passage, pressurized liquid chamber, pressure chamber, liquid chamber, liquid discharge chamber, and the like.)

As the actuator, an electromechanical transducer element is known. The electromechanical transducer element is disposed on a wall of the pressurized chamber and is formed of electromechanical transducer film made of a piezoelectric member sandwiched between a lower electrode (or a first electrode) and an upper electrode (or a second electrode). The electromechanical transducer element is deformable by a drive voltage applied between the two electrodes.

After forming the electromechanical transducer element (or piezoelectric element) including the lower electrode, an electromechanical transducer film (or piezoelectric film), and the upper electrode, a protective film may be formed using aluminum oxide or silicon oxide to cover at least a side wall of the electromechanical transducer element. When the electromechanical transducer film is exposed to hydrogen or oxygen in the air or immersed in a chemical solution in post-processing, the side wall of the electromechanical transducer film is protected by the protective film to prevent damage to the crystals of the electromechanical transducer film due to exposure to the air.

SUMMARY

In one embodiment of the disclosure, there is provided a method of producing an improved electromechanical transducer element. The method includes forming a first, common electrode on one of a substrate and an undercoat layer; forming an electromechanical transducer film on the first electrode; forming a second electrode on the electromechanical transducer film; forming a first protective film on an upper surface of the second electrode, the electromechanical transducer film, and a side wall of the second electrode; and selectively forming a second protective film on a portion of the first protective film protecting the electromechanical transducer film and the side wall of the second electrode.

In another embodiment of the disclosure, there is provided an improved liquid droplet discharge head that includes a nozzle to discharge liquid droplets; a liquid chamber to which the nozzle communicates; and a pressure generator to generate pressure to be applied to the liquid inside the liquid chamber. The pressure generator includes a diaphragm that forms part of a wall of the liquid chamber; and an electromechanical transducer element disposed on the diaphragm. The electromechanical transducer element includes a first, common electrode on one of a substrate and an undercoat layer; an electromechanical transducer film on the first electrode; a second electrode on the electromechanical transducer film; a first protective film on an upper surface of the second electrode, the electromechanical transducer film, and a side wall of the second electrode; and a second protective film in a portion of the first protective film covering the electromechanical transducer film and the side wall of the second electrode.

In yet another embodiment of the disclosure, there is provided an electromechanical transducer element produced by the above method, and an image forming apparatus including a liquid droplet discharge head.

These and other objects, features, and advantages of the present invention will become apparent upon consideration of the following description of the preferred embodiments of the present invention when taken in conjunction with the accompanying drawings.

BRIEF DESCRIPTION OF THE DRAWINGS

FIGS. 1A and 1B are schematic structural views of liquid droplet discharge section as a basic structure of a liquid droplet discharge head, in which FIG. 1A is an upper plan view of the liquid droplet discharge section and FIG. 1B is a cross-sectional view along line A-A' in FIG. 1A;

FIGS. 6A and 6B are schematic structural views of a liquid droplet discharge section as a basic structure of a liquid droplet discharge head according to an embodiment of the present invention, in which FIG. 6A illustrates an upper surface of the liquid droplet discharge section and FIG. 6B is a cross-sectional view along the line A-A' in FIG. 6A;

FIG. 7 is a scanning electron microscope (SEM) image of the cross section of a Sample A;

DETAILED DESCRIPTION

Hereinafter, preferred embodiments of the present invention will be described with reference to accompanying drawings.

Figure 1A:
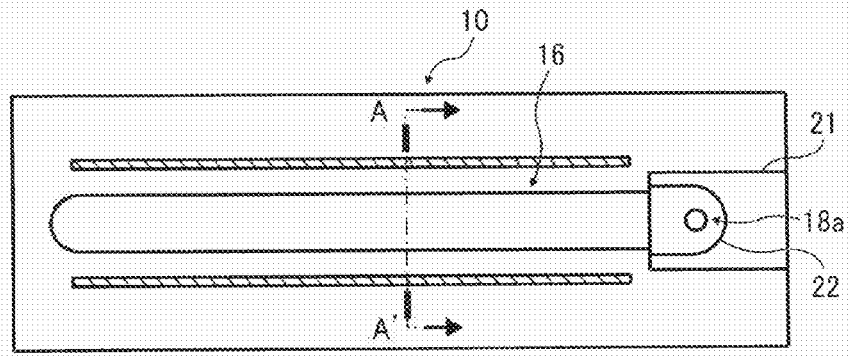
Figure 1B:
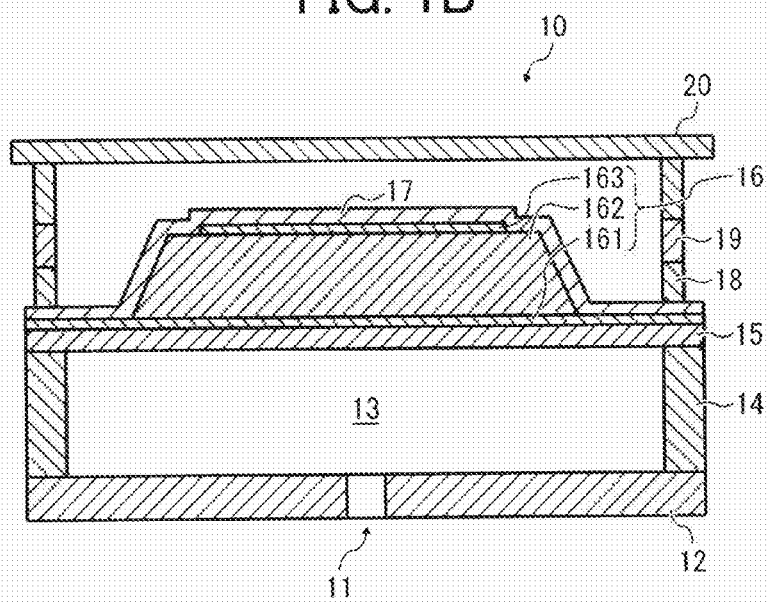
Figure 2:
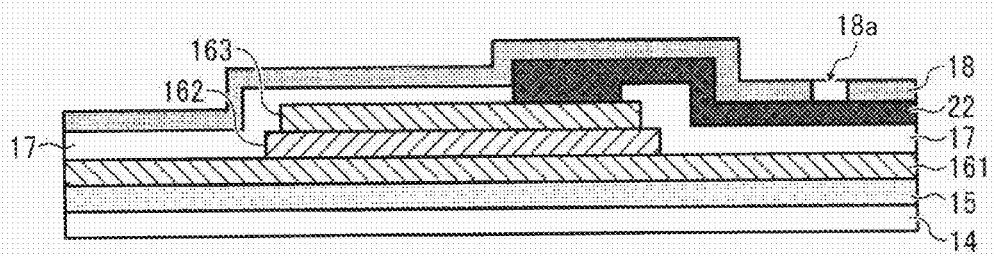
FIG. 2 is a cross-sectional view illustrating a layer structure of a diaphragm and piezoelectric elements on a substrate of the liquid droplet discharge section.

FIGS. 1A and 1B are schematic structural views of liquid droplet discharge section 10 as a basic structure of a liquid droplet discharge head. FIG. 1A is an upper plan view of the liquid droplet discharge section 10 and FIG. 1B is a cross-sectional view along line A-A'. FIG. 2 is a cross-sectional view perpendicular to the line A-A' of FIG. 1A and illustrates a layer structure of a diaphragm and piezoelectric elements on a liquid chamber substrate of the liquid droplet discharge section 10.

As illustrated in FIGS. 1A and 1B, the liquid droplet discharge section 10 includes a nozzle substrate 12 that includes a nozzle 11 to discharge liquid droplets such as ink and a liquid chamber substrate 14 on which a liquid chamber 13 that communicates to the nozzle 11 and contains the liquid is formed. Further, a diaphragm 15 and a piezoelectric element 16 are disposed on the liquid chamber substrate (hereinafter, simply "substrate") 14. The piezoelectric element 16 serves as an electromechanical transducer element to pressurize a liquid inside the liquid chamber 13 via the diaphragm 15. A first insulation protective film 17 serving as a first protective film, a second insulation protective film 18, a third insulation protective film 19, and a sub frame 20 are so disposed as to cover the piezoelectric element 16.

The piezoelectric element 16 includes a common electrode 161, a piezoelectric film 162 on the common electrode 161, and an individual electrode 163 on the piezoelectric film 162. The common electrode 161 is a lower electrode as a first electrode of the side of the substrate 14. The piezoelectric film 162 is made of piezoelectric zirconate titanate (PZT) as an electromechanical transducer film. The individual electrode 163 is an upper electrode as a second electrode disposed opposite the side of the substrate 14 of the piezoelectric film 162. The common electrode 161 is connected to a wire 21 via a contact hole formed in the first insulation protective film 17, and is connected, via the wire 21, to a pad electrode for the common electrode 161 that serves as the first terminal electrode for external connection. In addition, the individual electrode 163 is connected to a wire 22 via a contact hole 18a formed in the second insulation protective film 18, and is connected, via the wire 22, to a pad electrode for the individual electrode 163 as the second terminal electrode for external connection.

In the thus-configured liquid droplet discharge section 10, via the pad electrode for the common electrode 161 and the wire 21, and via the pad electrode for the individual electrode 163 and the wire 22, a drive voltage with a predetermined frequency and amplitude is applied to the common electrode 161 and the individual electrode 163 included in the piezoelectric element 16, respectively. As a result, the piezoelectric element 16 to which the drive voltage is applied vibrates to deform the diaphragm 15 disposed between the substrate 14 and the piezoelectric element 16 and liquid inside the liquid chamber 13 is pressurized due to the deformation of the diaphragm 15, so that a liquid droplet is discharged from the nozzle 11.

Next, materials and methods of producing each part and component that construct the liquid droplet discharge head will be described in detail.

<Substrate>

An example of the preferred material for the substrate 14 includes single-crystal silicon, which is formed to have a depth normally ranging from 100 [μm] to 600 [μm]. There are three types of plane directions for the single-crystal silicon, (100), (110), and (111). In general, (100) and (111) are widely used in the semiconductor industry. In the present embodiment, single-crystal substrate having the plane direction (100) is mainly used. In addition, when the liquid chamber or the pressure chamber 13 as illustrated in FIG. 1 is produced, the single-crystal silicon substrate is processed using etching. In this case, anisotropic etching is generally used. The anisotropic etching is performed using a different etching speed relative to the plane direction of the crystal structure. Specifically, in the anisotropic etching performed by soaking the single-crystal silicon in an alkali solution such as potassium hydrate (KOH), the etching speed of the (111) plane becomes approximately one four hundredth of the etching speed of the (100) plane. Accordingly, although a structure having an inclination of approximately 54 degrees can be formed with the plane direction (100), because a deep groove can be etched with the plane direction (111), a higher array density can be obtained while maintaining rigidity. Alternatively, the single-crystal substrate with the plane direction (110) can also be used. But in this case, there are other factors to be considered because silicon dioxide (SiO2) as a mask material is also etched.

<Diaphragm>

As illustrated in FIG. 1, the piezoelectric element 16 as the electromechanical transducer element generates pressure, and the diaphragm 15 disposed below the piezoelectric element 16 deforms, thereby causing the liquid droplet such as ink in the liquid chamber or the pressure chamber 13 to be discharged. Accordingly, it is preferred that the diaphragm 15 have a predetermined rigidity. Therefore, preferred materials for the diaphragm 15 include Si, $SiO_2$, and $Si_3N_4$ formed by chemical vapor deposition (CVD). Further, materials with a linear expansion coefficient which is nearer to that of the common electrode or the lower electrode 161 and of the piezoelectric film 162 are preferably selected. In particular, the piezoelectric film 162 is in general made of PZT. Accordingly, the materials of the diaphragm 15 preferably have a linear expansion coefficient ranging from $5 \times 10^{-6}$ (1/K) to $10 \times 10^{-6}$ (1/K), which approximates the linear expansion coefficient $8 \times 10^{-6}$ (1/K) of PZT. Furthermore, materials with the linear expansion coefficient ranging from $7 \times 10^{-6}$ (1/K) to $9 \times 10^{-6}$ (1/K) are more preferable, more specifically, aluminum oxide, zirconium oxide, iridium oxide, ruthenium oxide, tantalum oxide, hafnium oxide, osmium oxide, rhenium oxide, rhodium oxide, palladium oxide, and chemical compounds thereof. These materials are processed with a spin coater using sputtering method or sol-gel. The thickness of the diaphragm 15 is preferably from 0.1 [μm] to 10 [μm], and more preferably, from 0.5 [μm] to 3 [μm]. If the thickness is less than 0.1 [μm], processing of the liquid chamber or the pressure chamber 13 as illustrated in FIG. 1 becomes difficult. If the thickness is more than 10 [μm], the diaphragm 15 hardly deforms, and discharging of the liquid droplet such as ink droplet becomes unstable.

<Common Electrode (First Electrode)>

The common electrode 161 is preferably formed of any metal or metallic oxide. Herein, whichever material is used, an adherence layer is formed between the metal films forming the diaphragm 15 and the common electrode 161 to prevent separation or peeling. A detailed description of the metallic electrode film and the oxide electrode film including the adherence layer is deferred.

<Adherence Layer>

Exemplary formation of the adherence layer is described below.

A film made of titanium (Ti) is formed by sputtering, and the titanium film thus formed is oxidized with heat using a rapid thermal annealing (RTA) device, to thus obtain a titanium oxide film. Conditions of the thermal oxidation include: temperature ranging from 650[° C.] to 800[° C.], processing time from 1 min. to 30 min., and an $O_2$ atmosphere, for example. Among preparing methods for forming a titanium oxide film, the thermal oxidation method to oxidize the titanium film at a high temperature is more preferable than the reactive sputtering method because, in the reactive sputtering method, a special sputtering chamber is necessary to heat the silicon substrate at a high temperature. In addition, oxidation with the RTA device is more preferable than the oxidation using a normal furnace because the crystalline property of the titanium oxide film formed by the RTA device is optimal. If the oxidation is performed using a normal heating furnace, the titanium film apt to be oxidized easily forms many crystalline structures at a low temperature, so that those structures have to be destroyed once. As a result, the oxidation using the RTA device with a rapid temperature rising property allows optimal crystals to be formed.

Exemplary materials for use other than titanium or Ti include tantalum or Ta, iridium or Ir, rubidium or Ru, and the like. The thickness of the adherence layer is preferably from 10 [nm] to 50 [nm], and more preferably, from 15 [nm] to 30 [nm]. Outside this range, the adherence property of the adherence layer is not secure. When the thickness of the adherence layer is more than 50 [nm], a surface roughness of the lower electrode increases and the adherence property with the piezoelectric film decreases, so that the crystalline property of the piezoelectric film is adversely affected and sufficient deformation cannot be obtained <Metallic Electrode Film>

Exemplary materials for the metallic electrode film include platinum or Pt, which is conventionally used because of its high heat resistance and low reactivity. Platinum, however, does not have a high barrier property with regard to lead or Pb. Platinum group elements such as iridium and platinum-rhodium alloys and alloy films using these elements may be used. When platinum is used, the adherence property with an undercoat layer (such as $SiO_2$) is not optimal and therefore it is better to form an adherence layer in advance. Sputtering and vacuum deposition are used in general. The thickness of the metallic electrode film is preferably from 80 [nm] to 200 [nm], and more preferably, from 100 [nm] to 150 [nm]. When the metallic electrode film is thinner than the above range, a sufficient current cannot be supplied to the common electrode 161, thereby adversely affecting the liquid droplet discharging. If the metallic electrode film is thicker than the above range, use of the platinum group elements may increase the production cost. In addition, if platinum is used, when the thickness is gradually increased, the surface roughness increases, which may adversely affect the surface roughness and the crystalline orientation of the oxide electrode film and PZT to be formed on the platinum film, and deformation sufficient for the ink discharge cannot be obtained.

<Oxide Electrode Film>

Exemplary materials for the oxide electrode film include titanium or Ti. The oxide electrode film is formed by the sputtering method. The oxidation method of the oxide electrode film employs the RTA device as in the formation of the adherence layer, and the process is performed under conditions of: temperature ranging from 650[° C.] to 800[° C.], processing time from 1 min. to 30 min., and an $O_2$ atmosphere, for example. The reason for using the RTA device is the same as that described in the formation of the adherence layer. The thickness of the TiOx electrode film is preferably from 3 [nm] to 15 [nm]. As the materials for the sputtering film formation, other than Ii, Ti/Ir, PbO/TiOx, LNO, and the like are preferably used.

<Piezoelectric Film (Electromechanical Transducer Film)>

PZT is mainly used as the material for the piezoelectric film 162. PZT is a solid dispersion of lead zirconate ($PbZrO_3$) and lead titanate ($PbTiO_3$) and exhibits different properties depending on the ratios of these compounds. Optimal piezoelectric properties are obtained when ratios of $PbZrO_3$ and $PbTiO_3$ are 53:47, which is represented by chemical formulae: $Pb(Zr0.53, Ti0.47)O_3$, or in general, as PZT (53/47).

Other than PZT, the composite oxide includes barium titanate. When using barium titanate, barium alkoxide and titanium alkoxide compounds are used as initial materials and barium titanate precursor solution is prepared by dissolving the initial materials methods of producing a common solvent. These materials are described by a general formula $ABO_3$, which is a composite oxide mainly including A that corresponds to Pb, Ba, or Sr, and B that corresponds to Ti, Zr, Sn, Ni, Zn, Mg, or Nb. A specific description includes $(Pb1-x, Ba)(Zr, Ti)O_3$, and $(Pb1-x, Sr)(Zr, Ti)O_3$ obtained by partly replacing Pb as A with Ba or Sr. Such replacement is possible as long as the replaced element is a divalent element, and due to the replacement, a reduction in degradation of a specific property due to evaporation of lead during thermal processing is obtained.

As a method of producing the piezoelectric film 162, the sputtering method or the sol-gel method is used and the spin coater is used. In this case, because patterning is necessary, a desired pattern can be obtained by photolithographic etching and the like. When PZT is prepared by the sol-gel method, lead acetate, zirconium alkoxide, and titanium alkoxide as initial materials are dissolved in methoxy ethanol as a common solvent, so that a homogeneous solution can be obtained and the PZT precursor solution can be prepared. Because metallic alkoxide compounds are susceptible to hydrolysis due to moisture in the atmosphere, an appropriate amount of acetylacetone, acetic acid, or diethanolamine may be added as a stabilizer to the precursor solution.

When the piezoelectric film (PZT film) 162 is formed over the whole surface of the substrate 14, a coating film is formed by a solution coating method such as spin coating, and the formed film is subjected to various thermal processes including solvent drying, thermal decomposition, and crystallization. When the coated film is transformed into a crystallized film, the volume of the film contracts. To obtain a crack-free film, the precursor density needs to be adjusted so as to obtain a thickness less than 100 [nm] in one-time process.

The thickness of the piezoelectric film 162 preferably ranges from 0.5 [μm] to 5 [μm] and more preferably from 1 [μm] to 2 [μm]. When the thickness is less than 0.5 [μm], sufficient transformation or displacement is not generated. When the thickness is more than 5 [μm], because several layers are laminated one after another, the number of processes increases and processing time becomes lengthy.

In addition, specific dielectric constant of the piezoelectric film 162 preferably ranges from 600 to 2,000, and more preferably from 1,200 to 1,600. When the specific dielectric constant is less than 600, sufficient transformation or displacement is not generated. When the specific dielectric constant thereof is more than 1,200, polarization is insufficient, thereby degrading the displacement property after repeated use.

<Individual Electrode (Second Electrode)>

The individual electrode 163 is preferably formed of any metal or metallic oxide. Details of an oxide electrode film and a metallic electrode film will be described.

<Oxide Electrode Film>

Exemplary materials for the oxide electrode film includes strontium ruthenium oxide or $SrRuO_3$ (hereinafter, "SRO"). Other than $SrRuO_3$, materials represented by $Sr_x(A)_{(1-x)}Ru_y(1-y)$ are preferred, in which A=Ba, Ca; B=Co, Ni; and x or y=0 to 0.5. The oxide electrode film is formed by a film formation method such as sputtering. The thickness of the oxide electrode film (or SRO film) is preferably from 20 [nm] to 80 [nm], and more preferably, from 40 [nm] to 60 [nm]. If the film is thinner than the above range, sufficient and optimal initial transformation or displacement property is not obtained. In addition, when the thickness of the oxide electrode film exceeds the above range, dielectric strength voltage of the later film-formed piezoelectric film (PZT film) is very bad, and leakage tends to occur.

<Metallic Electrode Film>

Preferred materials for the metallic electrode film are the same used for the metallic electrode film of the common electrode or the first electrode 161 as described above. The thickness of the metallic electrode film is preferably from 30 [nm] to 200 [nm], and more preferably, from 50 [nm] to 150 [nm]. If the film is thinner than the above range, a sufficient current cannot be supplied as the individual electrode 163, and failure occurs when the liquid droplet is discharged. Further, if the metallic electrode film is thicker than the above range, use of the precious material included in the platinum group elements may increase the production cost. In addition, if the platinum is used as the material, when the thickness becomes gradually thicker, the surface roughness increases and process failure tends to occurs such as the film peeling off when wiring is through the insulation protective film.

<First Insulation Protective Film>

Cares should be paid when selecting materials for the first insulation protective film 17 and preferred materials thereof include dense inorganic materials that can prevent damage to the piezoelectric element in the film formation and etching processes and prevent permeation of moisture in the atmosphere. In addition, when organic material is used for the first insulation protective film 17, the thickness should be enough to obtain sufficient protection performance, and therefore organic material is not suitable.

When the first insulation protective film 17 is a thick film, vibration of the diaphragm 15 is strong enough to degrade discharge of the liquid droplet discharge head. To obtain good protection, use of oxide, nitride, and carbonized film is preferable; however, materials having a high adherence property with materials for the electrode as a base of the first insulation protective film 17, for the piezoelectric member, and for the diaphragm need to be selected. In addition, a film formation method of the first insulation protective film 17 that does not damage the piezoelectric element 16 should be selected. Accordingly, plasma CVD, in which reactive gas is turned into plasma which is accumulated on the substrate, or the sputtering method, in which plasmas are ejected toward a target member and sputtered ions fly so that a film is formed, are not preferred. Examples of film formation methods preferably used for the first insulation protective film 17 include vapor deposition, atomic layer deposition (ALD), and the like. From a wide variety of useable materials, the ALD method is preferable. Preferred materials for the first insulation protection layer include oxide films for use as materials for ceramics and include $Al_2O_3$, $ZrO_2$, $Y_2O_3$, $Ta_2O_3$, $TiO_2$, and the like. In particular, by using ALD, a thin film having a very high density can be formed, thereby preventing any damage from occurring in the processing.

The first insulation protective film 17 needs to be as thin as possible to provide good protection of the piezoelectric element 16 and allow the diaphragm 15 to be deformed or displaced. The thickness of the first insulation protective film 17 preferably ranges from 20 [nm] to 100 [nm]. When the thickness thereof is greater than 100 [nm], because the deformation or displacement amount of the diaphragm 15 decreases, liquid discharge performance of the liquid droplet discharge head is low. On the other hand, if the thickness thereof is less than 20 [nm], because the function of the piezoelectric element 16 as a protection layer becomes insufficient, performance of the piezoelectric element 16 decreases as described above.

<Second Insulation Protective Film>

Exemplary materials suitable for the second insulation protective film 18 includes specific oxide, nitride, carbonate, or composite compound including the foregoing materials, and alternatively, $SiO_2$ that is used in general for semiconductor devices can be used. Methods used for the film formation of the second insulation protective film 18 include, for example, CVD method, sputtering method, and ALD method. CVD method capable of forming a film isotropically is preferably used considering stepwise deposition of the pattern forming part of the electrode forming part. The thickness of the second insulation protective film 18 needs to have a depth such that the voltage applied to a portion between the common electrode (i.e., the lower electrode) 161 and the wire 21 of the individual electrode 163 does not break down the insulation thereof. Specifically, the strength of the electric field applied to the second insulation protective film 18 needs to be set at a range that the insulation breakdown does not occur. Further, when considering the surface roughness or pin holes of the undercoat layer of the second insulation protective film 18, the thickness of the second insulation protective film 18 needs to be more than 200 [nm] and more preferably more than 500 [nm].

<Wires and Pad Electrode>

It is preferred that the materials for the wires 21, 22 and a pad electrode be metallic materials for the electrode formed of any one of Ag alloy, Cu, Al, Au, Pt, or Ir. Those electrodes can be formed using a sputtering method, spin coating method, and the like, and thereafter, a desired pattern is obtained via photolithographic etching, and the like. The thickness of the pad electrode is preferably from 0.1 [μm] to 20 [μm], and more preferably, from 0.2 [μm] to 10 [μm]. If the thickness is less than the above range, the resistance increases and a sufficient current cannot be supplied to the electrode, so that the liquid droplet discharge from the head becomes unstable. By contrast, if the thickness is more than the above range, the process time becomes lengthy. In addition, a contact resistance at the contact hole (for example, with an area 10 [μm]×10 [μm]) through which the common electrode 161 and the individual electrode 163 can be connected, is set to less than 10 [Ω] for the common electrode 161 and less than 1 [Ω] for the individual electrode 163. More preferably, less than 5 [Ω] for the common electrode 161 and less than 0.5 [Ω] for the individual electrode 163. If the resistance is higher than the above range, a sufficient current cannot be supplied, and failure occurs when the liquid droplet is discharged.

<Third Insulation Protective Film>

The third insulation protective film 19 serves as a passivation layer that also functions as a protection layer for the first wire 21 of the common electrode and the second wire 22 of the individual electrode. As illustrated in FIG. 1, the individual electrode 163 and the common electrode 161 are coated excluding an outgoing portion of the individual electrode 163 and an outgoing portion (i.e., the contact hole 18a) of the common electrode 161. With this structure, cost effective aluminum Al or an alloy mainly formed of Al may be used for the material of the electrode. As a result, a low-cost and highly-reliable liquid droplet discharge head (or an inkjet head) can be obtained.

Materials for the third insulation protective film 19 include any inorganic material and organic material, but with low moisture permeability. Exemplary inorganic materials include oxide, nitride, and carbonate, and exemplary organic materials include polyimide, acrylic resin, and urethane resin. However, if the organic material is used, the thickness needs to be thick, so that organic materials are not suitable for patterning. Thus, inorganic materials are preferable because the wiring protection function is obtained even with a thin film. In particular, use of $Si_3N_4$ on Al wiring that exerts efficiency for use in the semiconductor devices, is preferable. In addition, the thickness is preferably more than 200 [nm], and more preferably more than 500 [nm]. If the thickness is not sufficient, a sufficient passivation effect cannot be exerted, and breaking of wire occurs due to corrosion of the wire materials, thereby degrading reliability in inkjet discharging.

In addition, it is preferred that openings are disposed on the piezoelectric element 16 and the diaphragm 15 around the piezoelectric element 16 to allow the piezoelectric element 16 to exert its optimal performance. With this configuration, a highly efficient and reliable liquid droplet discharge head (or inkjet head) can be formed. Because the piezoelectric element 16 is protected by the first and second insulation protective films 17, 18, the opening of the third insulation protective film 19 can be formed by the photolithography method and dry etching. In addition, an area of the pad electrode is preferably larger than 50×50 [$\mu m^2$] and more preferably larger than 100×300 [$\mu m^2$]. If the area is less than the above range, sufficient polarization process cannot be done, and the deformation or displacement after continuous driving may not obtain a sufficient property.

Next, an example of a method of producing the liquid droplet discharge section 10 will be described.

Figure 3:
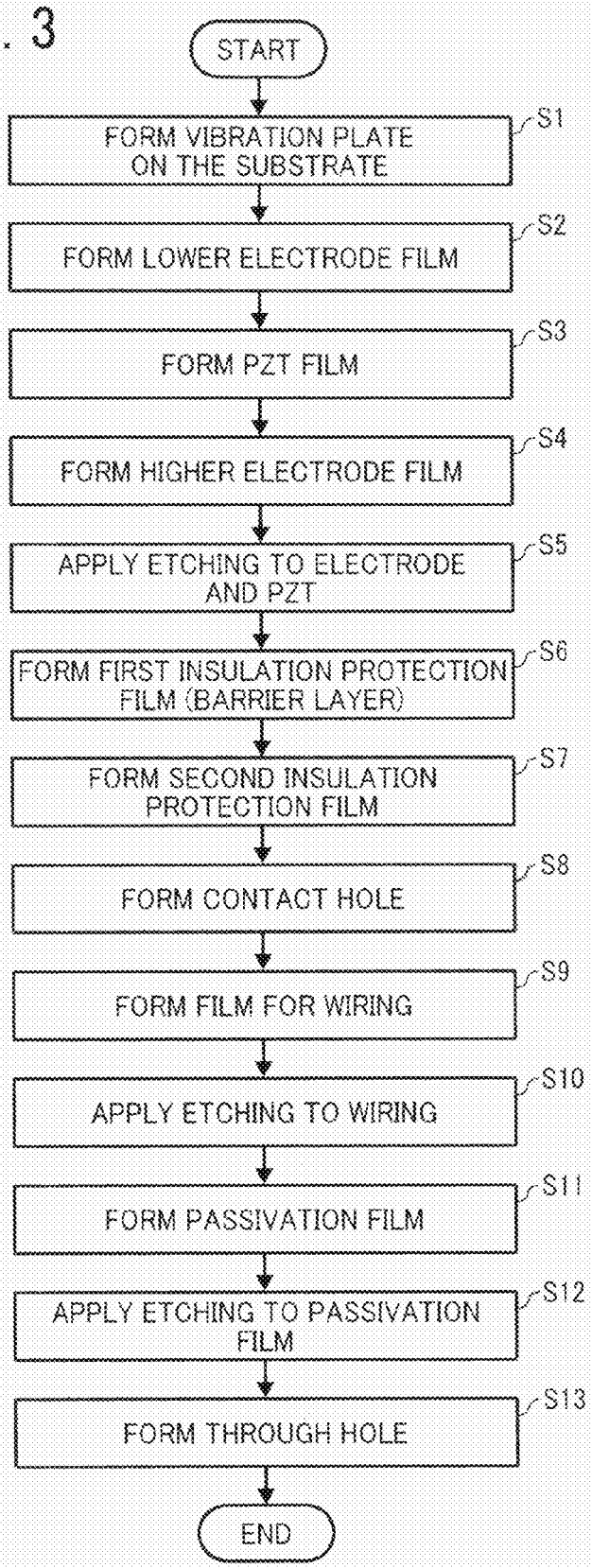
FIG. 3 is a flowchart illustrating steps in one exemplary production process of the liquid droplet discharge section.

FIG. 3 is a flowchart illustrating steps in one exemplary production process of the liquid droplet discharge section.

First, on the substrate 14, a diaphragm 15 is formed (in Step S1). A silicon wafer having a thickness of 625 [$\mu m$] is used as a substrate 14. The diaphragm 15 including a thermal oxidation film, a silicon oxide film, a silicon nitride film, and a polysilicon film formed, for example, by the CVD method is disposed on the substrate 14.

Next, the piezoelectric element 16 is formed on the diaphragm 15. In producing the piezoelectric element 16, first, the film formation of the lower electrode being the common electrode 161 is done (S2), the film formation of PZT film being the piezoelectric film 162 is subsequently done (S3) and the film formation of the upper electrode being the individual electrode 163 is done (S4).

The film formation of the lower electrode in Step S2 is specifically done as follows. First, as an adherence film, the titanium film having a thickness of 30 [nm] is formed by the sputtering device and is subject to the thermal oxidation using RTA at 750[° C.]. Thereafter, a platinum film having a thickness of 100 [nm] is formed, and SrRuO3 film as an oxide film having a thickness of 60 [nm] is formed by sputtering. The film formation by the sputtering is performed heating the substrate at 550[° C.].

In the above Step S3, the PZT film is formed to a desired thickness by the sol-gel method.

The film formation of the upper electrode in Step S4 is performed by using $SrRuO_3$ film as an oxide film having a thickness of 40 [nm] and Pt film as a metallic film having a thickness of 125 [nm], both are formed by sputtering.

Thereafter, film formation is performed to Photoresist (TSMR8800, product name) produced by Tokyo Ohka Kogyo Co., Ltd. by spin coating method, and a resist pattern is formed using a normal photolithography. Then, the PZT film and the upper electrode are individuated by etching using inductively couple plasma (ICP) etching device (produced by SAMCO Inc.), and patterns are formed (S5). Due to this process, the upper electrode functions as an individual electrode and the lower electrode functions as a common electrode for the individuated PZT film and the upper electrode.

Next, as the first insulation protective film 17, $Al_2O_3$ film is formed by ALD method (S6). The first insulation protective film 17 functions as a barrier layer to protect the piezoelectric element 16 from process damage such as hydrogen. By using $Al_2O_3$ film formed by the ALD method for the first insulation protective film 17 or the barrier layer, a high-quality barrier layer having low moisture permeability can be obtained.

The thickness of the first insulation protective film 17 functioning as a barrier layer preferably ranges from 30 [nm] to 80 [nm]. With this structure, while keeping a sufficient barrier property as a barrier layer, the first insulation protective film 17 maintains a function as an actuator of the piezoelectric element 16.

In addition, a taper angle as an angle formed between the surface of the substrate 14 and a side wall of the second insulation protective film 18 is preferably smaller than that formed between the surface of the substrate 14 and the side wall of the piezoelectric element 16. With this structure, a concentration of stress at lateral ends of the piezoelectric element 16 is moderated, thereby making the lifetime longer and improving the reliability.

Next, as the second insulation protective film 18, an $SiO_2$ interlayer film is formed (S7). By using $SiO_2$ film disposed between two layers, without adding a new step, a second protective film is further prepared for a portion covering the side wall of the piezoelectric element 16 among the first insulation protective film 17 (or the barrier layer). Accordingly, reduction of the production performance and the increase of the production cost can be prevented. In addition, in the photolithography etching process as a post-process, the side wall of the piezoelectric element 16 is masked by the resist and is subject to etching, thereby allowing the $SiO_2$ interlayer film to be remained at a portion covering the side wall of the piezoelectric element 16 among the first insulation protective film 17 (or the barrier layer). Accordingly, an excessive etching of the first insulation protective film 17 or the barrier layer can be securely prevented.

The above SiO2 interlayer film preferably has a thickness ranging from 10 [nm] to 500 [nm]. If the thickness thereof is less than 10 [nm], a sufficient etching tolerance cannot be secured. By contrast, if the thickness thereof is more than 500 [nm], the piezoelectric element 16 is not deformable, so that the function as an actuator is not maintained.

Thereafter, a contact hole 18a is formed by etching (S8). The Al film formation by sputtering is performed to form a wire (S9). Then, the Al of which film is formed in Step S8 is subject to etching and patterning is done (S10).

Furthermore, SiN passivation layer is formed as the third insulation protective film 19, and the formed layer is subject to etching (S11, S12).

Finally, a through-hole of the ink supply portion is formed by etching (S13).

Through above processes, the etching process ends.

Figure 4:
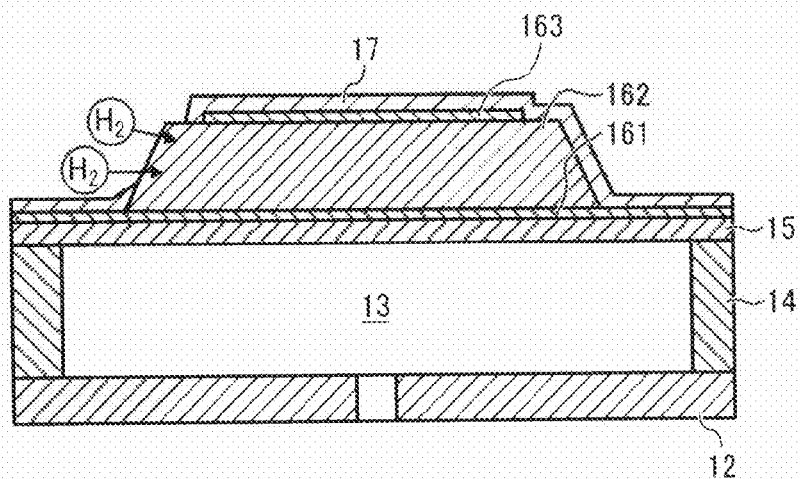
FIG. 4 illustrates a state in which a piezoelectric film is damaged due to a reduction effect of hydrogen ($H_2$) in the atmosphere.
Figure 5:
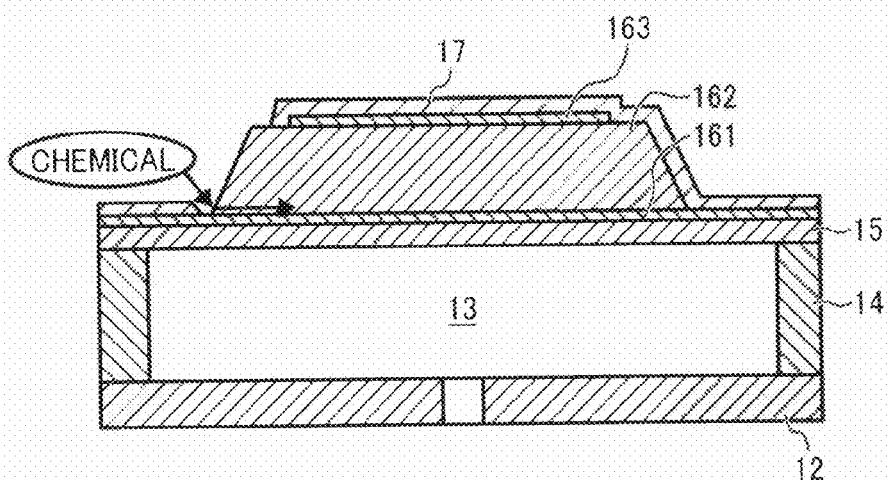
FIG. 5 is a cross-sectional view illustrating film floating of the piezoelectric film due to a chemical solution.

In the drive part of the above-configured liquid droplet discharge section 10, the wire etching process and the second insulation protective film 18 etching process are performed to prevent degradation of the deformation or displacement of the piezoelectric element 16. However, during the etching process, the excessive etching proceeds to the $Al_2O_3$ film being the first insulation protective film 17, thereby degrading barrier layer performance. If barrier layer performance is degraded, in the later post-process, the piezoelectric film or the PZT film 162 is damaged due to a reduction effect of the hydrogen ($H_2$) as illustrated in FIG. 4. In addition, as illustrated in the cross-sectional view of FIG. 5, chemicals enter the layer between the common electrode 161 and the piezoelectric film 162, thereby causing film floating to occur due to excessive etching of the first insulation protective film 17 as the barrier layer, because the resist thickness of the side wall of the piezoelectric film (or the PZT film) 162 becomes too thin in the etching process.

In the present embodiment, the second insulation protective film 18 is selectively applied to a portion protecting the side wall of the piezoelectric film 162 and the individual electrode 163 among the first insulation protective film 17 (the barrier layer).

Figure 6A:
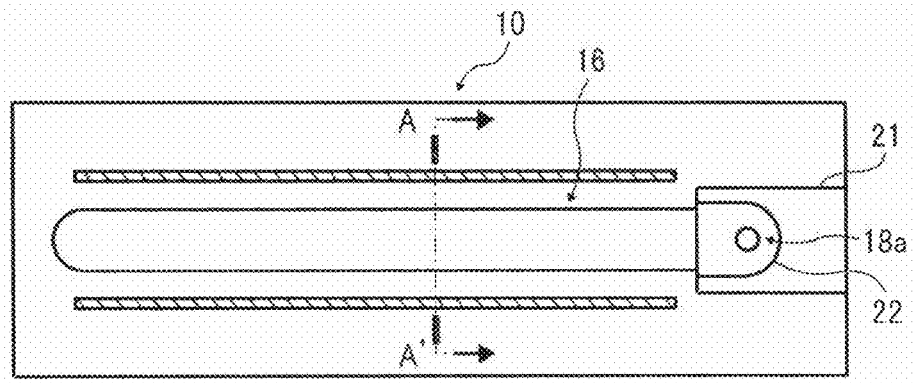
Figure 6B:
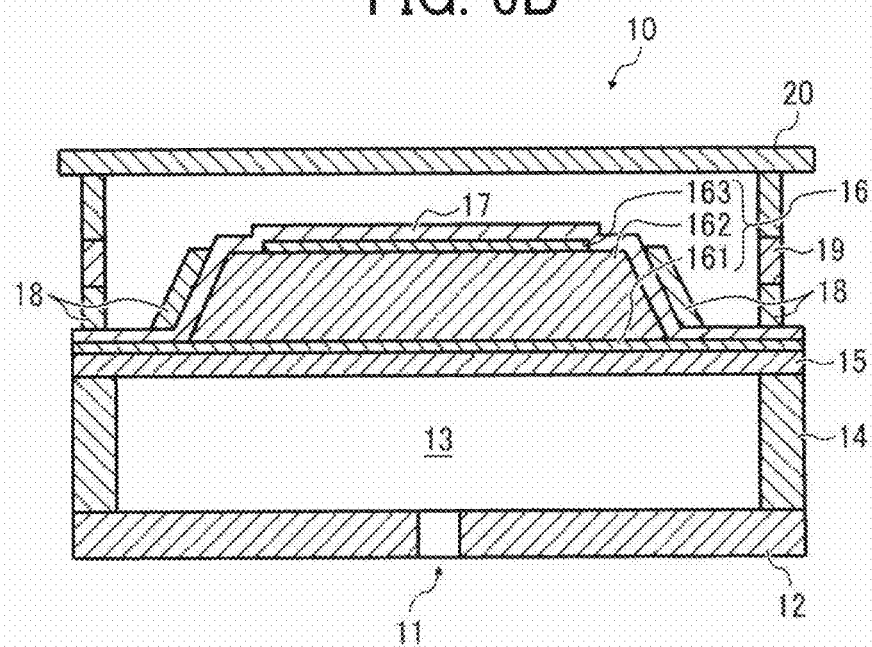

FIGS. 6A and 6B are schematic structural views of liquid droplet discharge section 10 as a basic structure of a liquid droplet discharge head. FIG. 6A illustrates an upper surface of the liquid droplet discharge section 10 and FIG. 6B is a cross-sectional view along the line A-A' in FIG. 6A. As illustrated in FIGS. 6A and 6B, in the etching process after film formation of an $SiO_2$ interlayer film being the second insulation protective film 18 performed after film formation of the first insulation protective film 17 as a barrier layer, the $SiO_2$ interlayer film is allowed to remain on the side wall of the piezoelectric film 162. Thus, the remaining portion of the $SiO_2$ interlayer film is defined as a second protective film added to improve the property as a barrier layer for the side wall of the piezoelectric film 162.

Next, results of experiments will be described. Two structures were compared: one is a structure in which the $SiO_2$ interlayer film is allowed to remain on the side wall of the piezoelectric film 162 to thus form the second protective layer, and the other is a structure in which the second protective film is not formed for the barrier layer as a comparative example.

Two types of mask patterns were provided to perform etching to the $SiO_2$ interlayer film. Then, the droplet discharge portion (Sample A) as illustrated in FIG. 6B including the $SiO_2$ interlayer film disposed on the side wall of the piezoelectric film 162 and the droplet discharge portion (Sample B) as illustrated in FIG. 1B without $SiO_2$ interlayer film were compared.

FIG. 7 is a scanning electron microscope (SEM) image of the cross section of Sample A. As illustrated in FIG. 7, in Sample A, $SiO_2$ interlayer film as the second insulation protective film 18 is disposed on the side wall of the piezoelectric film 162.

In addition, to compare difference in the process tolerance of the above two samples A and B, both samples were heated at 300[° C.] for 30 minutes in nitrogen atmosphere including approximately 1[%] hydrogen.

Figure 8:
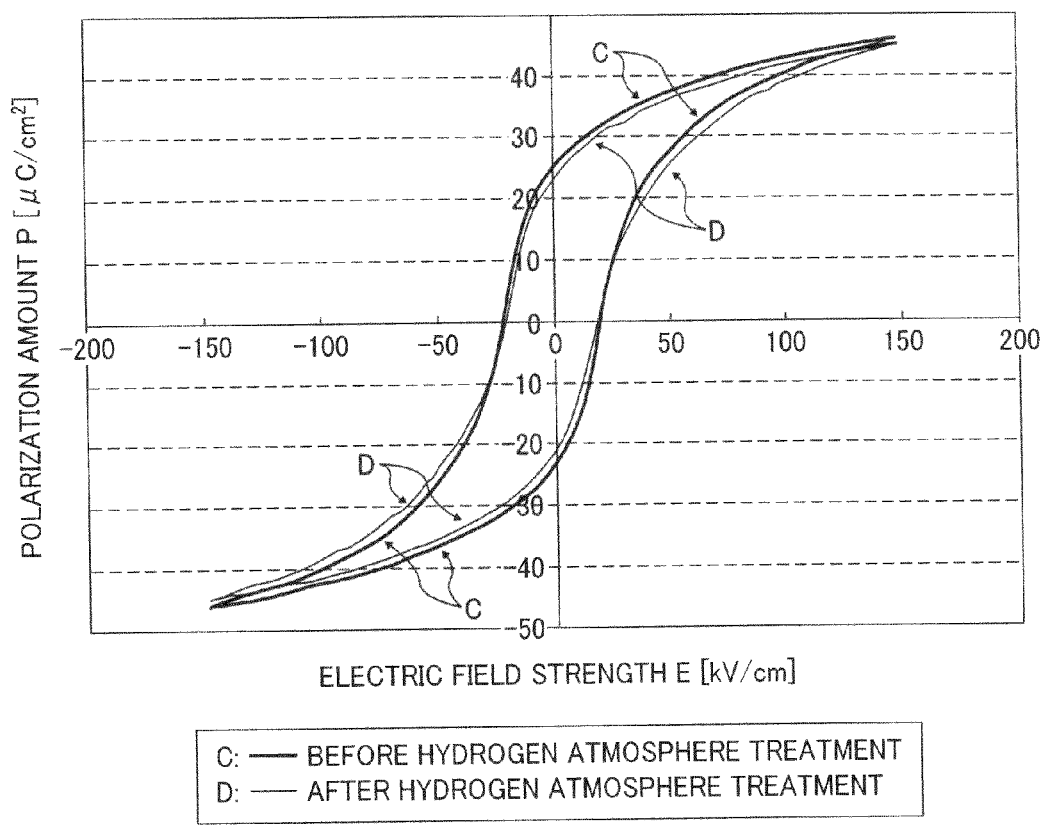
FIG. 8 is a hysteresis loop curve relating to Sample A showing a relation between an electric field strength E of the piezoelectric element and a polarization amount P measured before and after heating.
Figure 9:
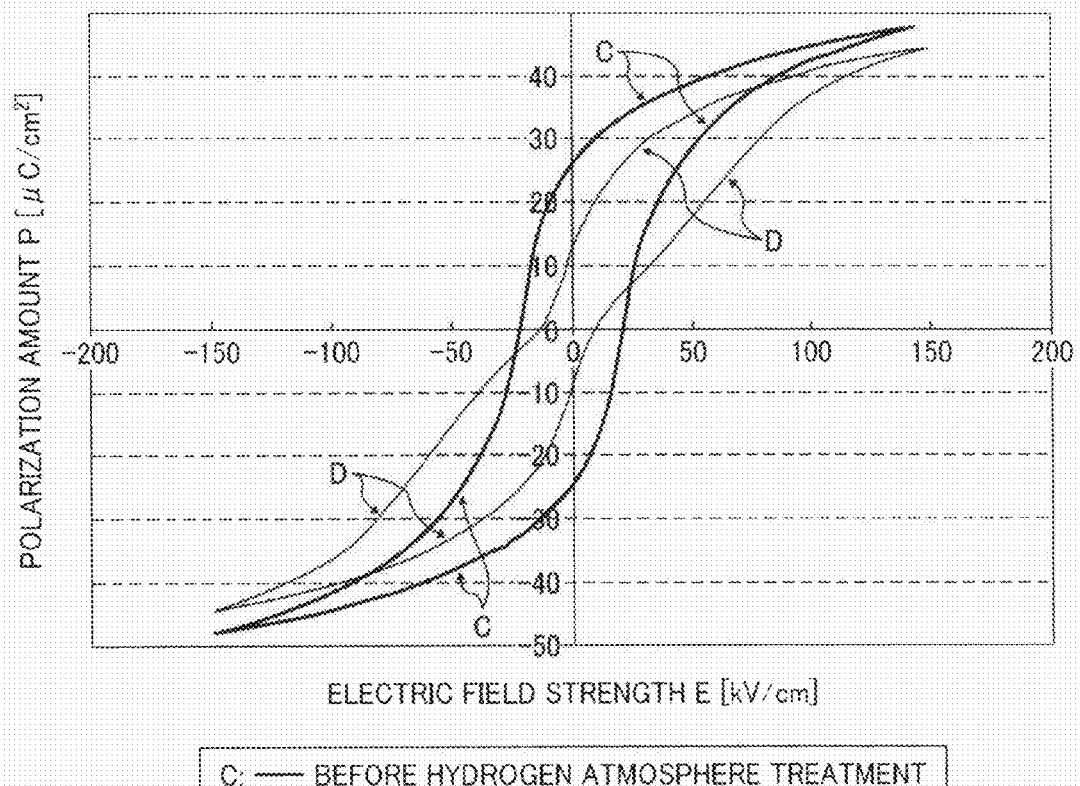
FIG. 9 is a hysteresis loop curve relating to a Sample B showing a relation between an electric field strength E of the piezoelectric element and a polarization amount P measured before and after heating.

FIGS. 8 and 9 are hysteresis loop curves showing a relation between the electric field strength E [kV/cm] of the piezoelectric element and a polarization amount P [$\mu C/cm^2$] measured before and after the above heating process. FIG. 8 relates to Sample A, and FIG. 9 relates to Sample B. In each figure, curves C are hysteresis loop curves measured before the heating process and curves D are hysteresis loop curves measured after the heating process.

It is observed from the hysteresis loop curves of FIG. 8, in Sample A, the properties are not changed before and after the heating process. By contrast, in Sample B, as is observed from the hysteresis loop curves of FIG. 9, double hysteresis loop curves are formed and the polarization amount after the heating process decreases and the properties are degraded. The reason for the degradation is because in Sample B, the barrier layer on the side wall of the piezoelectric member is lost due to over-etching, and $H_2$ enter therefrom, thereby causing the piezoelectric member to be degraded.

Next, 5 pieces each of Samples A and B were prepared and failure tolerance of each Sample under continuous operation was evaluated. A voltage of 0 [V] was applied to the lower electrode, a voltage of 30 [V] was applied to the upper electrode, and the samples were driven by frequency of 300 [kHz].

Table 1 shows a number of times that the piezoelectric element (i.e., actuator) of each sample is driven until failed. From the results shown in Table 1, it is understood that Sample A is better than Sample B in the failure tolerance. This is because, when the actuator is driven, the largest stress is applied to end portions (side walls) of the PZT film, and the $SiO_2$ interlayer film is disposed on the side walls of the PZT film, thereby moderating the stress.

TABLE 1

| Sample No. | Number of driving actuator until failed | Average |
|---|---|---|
| A1 | $5.00 \times 10^{11}$ | $1.65 \times 10^{12}$ |
| A2 | $6.20 \times 10^{11}$ | |
| A3 | $5.90 \times 10^{10}$ | |
| A4 | $6.30 \times 10^{12}$ | |
| A5 | $7.50 \times 10^{11}$ | |
| B1 | $5.90 \times 10^{10}$ | $3.41 \times 10^{10}$ |
| B2 | $5.00 \times 10^{10}$ | |
| B3 | $6.50 \times 10^{9}$ | |
| B4 | $3.00 \times 10^{9}$ | |
| B5 | $5.20 \times 10^{10}$ | |

Figure 10:
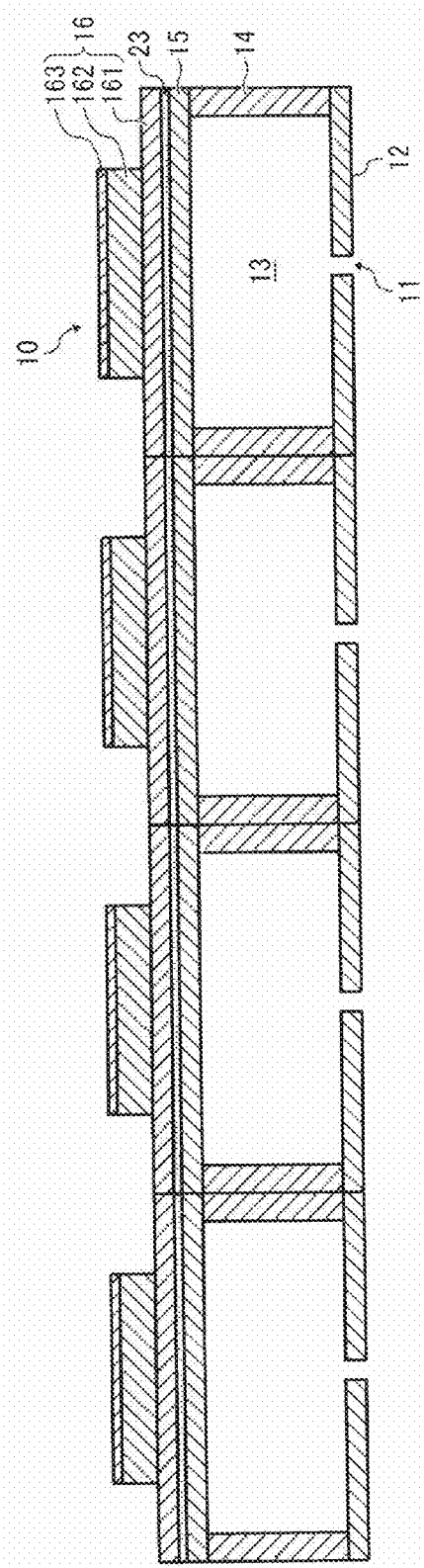
FIG. 10 is a cross-sectional view of an exemplary liquid droplet discharge head according to an embodiment of the present invention.

It is noted that, in the present embodiment, the droplet discharge section including one nozzle is described, but the structure thereof is not limited, and plural droplet discharge sections can be provided. FIG. 10 shows a liquid droplet discharge head including a plurality of liquid droplet discharge sections disposed in parallel, in which the same reference number as employed in FIG. 1 is applied to the same part. As illustrated in FIG. 10, an adherence layer 23 can be disposed between the diaphragm 15 and the common electrode (or the lower electrode) 161. In FIG. 10, illustration of liquid supply means, flow path, fluid resistance, and the like is omitted, and other parts and components that can be disposed to the liquid droplet discharge head may be provided.

Next, a structure of the image forming apparatus as a droplet discharge device including the above-structure liquid droplet discharge head will be described. Although not limited in particular, a structure of an inkjet recording apparatus as one such image forming apparatuses will be described.

Figure 11:
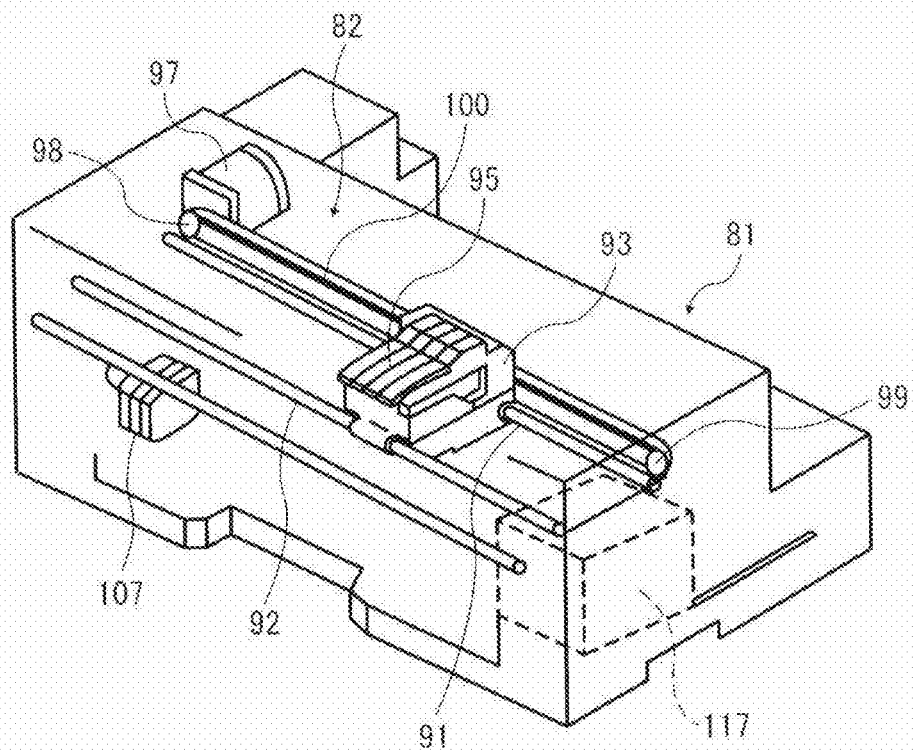
FIG. 11 is a perspective view of an exemplary image forming apparatus according to an embodiment of the present invention.
Figure 12:
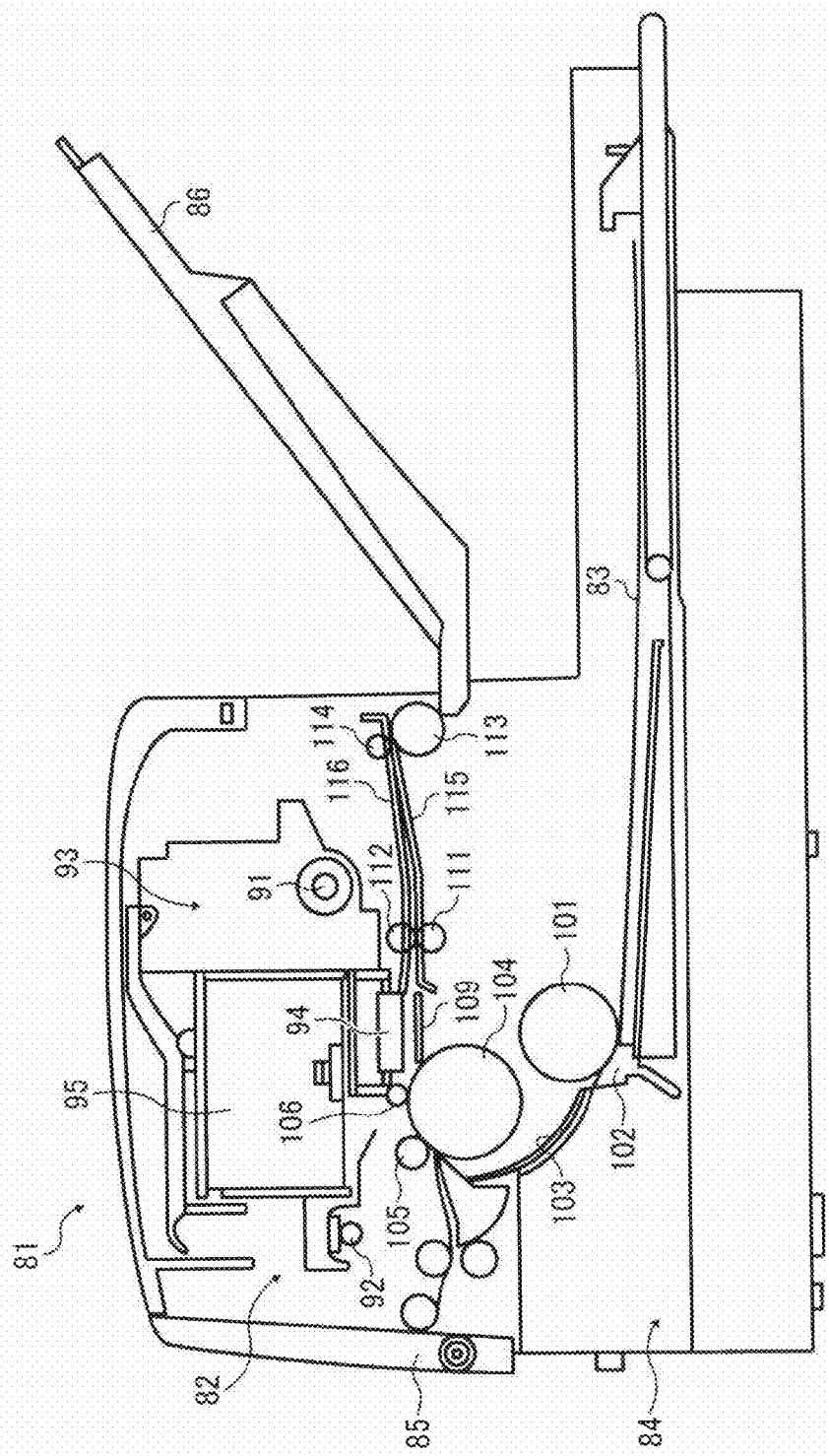
FIG. 12 is a side view illustrating the image forming apparatus.

FIG. 11 is a perspective view of the inkjet recording apparatus, and FIG. 12 is a side view illustrating the inkjet recording apparatus.

The inkjet recording apparatus includes an apparatus body 81 and a carriage 93 movable in the main scanning direction. The inkjet recording apparatus further includes a recording head mounted on the carriage 93, and a printing unit 82 including ink cartridges to supply ink to the recording head. A paper tray 84 on which a plurality of sheets 83 can be stacked is disposed at a front, bottom side of the apparatus body 81. The paper tray 84 can be drawn out from and in to the front of the apparatus body 81. A manual tray 85 is also disposed and can be bent to open to feed the sheet 83 manually. The sheet 83 fed out from the paper tray 84 or the manual tray 85 is conveyed to the printing unit 82, where a predetermined image is recorded thereon, and is discharged to a paper ejection tray 86 disposed at the rear side of the apparatus.

The printing unit 82 includes a main guide rod 91 and an auxiliary guide rod 92, which are guide members disposed laterally between right and left side plates and slidably hold the carriage 93 to be movable in a main scanning direction. A recording head 94 is formed of inkjet heads to discharge ink droplets of each color of yellow (Y), cyan (C), magenta (M), and black (Bk). The recording head 94 is mounted on the carriage 93. The recording head 94 includes a plurality of ink discharging outlets (nozzles) arranged in a direction perpendicular to the main scanning direction, with the ink droplet discharging direction oriented downward. Ink cartridges 95 to supply ink of respective colors to the recording head 94 are mounted replaceably to the carriage 93.

The ink cartridge 95 includes an upper hole to communicate with external air, a supply port to take in the ink and disposed on a bottom thereof, and a porous body in an inside thereof. The ink supplied to the inkjet head is kept at a slight negative force due to capillary force of the porous body. In the exemplary embodiment, a plurality of recording heads 94 for respective colors are used as the recording head; however, only one recording head including nozzles to discharge ink droplet of each color may be employed.

The carriage 93 slidably engages the main guide rod 91 at the rear side of the apparatus (downstream in the sheet conveyance direction) and slidably engages the auxiliary guide rod 92 at the front side of the apparatus (upstream in the sheet conveyance direction). To move the carriage 93 in the main scanning direction, a timing belt 100 is disposed between a drive pulley 98 driven by a main scanning motor 97 and a driven pulley 99. The timing belt 100 is fixed to the carriage 93, so that the carriage 93 is driven to move reciprocally back and force due to the back and force rotation of the main scanning motor 97.

On the other hand, to convey the sheet 83 placed in the paper tray 84 to a portion below the recording head 94, further provided are a sheet feed roller 101 and a friction pad 102, both to separate and convey the sheet 83 one by one, and a guide member 103 to guide the sheet 83. Further, a conveyance roller 104 to reverse and convey the fed sheet 83, another conveyance roller 105 to be pressed against a peripheral surface of the conveyance roller 104, and a front end roller 106 to define a conveyance angle of the sheet 83 from the conveyance roller 104. The conveyance roller 104 is driven by a sub-scan motor 107 via a gear array.

Further, a sheet receiver 109 is disposed below the recording head 94 to guide the sheet 83 conveyed from the conveyance roller 104 corresponding to a moving range of the carriage 93 in the main scanning direction. Further, a conveyance roller 111 and a spur 112 are disposed downstream of the sheet receiver 109 in the sheet conveyance direction and rotate to convey the sheet 83 to a sheet ejection direction. Furthermore, a paper ejection roller 113 and a spur 114 to send out the sheet 83 to a sheet ejection tray 86 and guide members 115 and 116 to form a sheet ejection path are disposed.

In recording operation, the recording head 94 is driven in response to image signals, while moving the carriage 93, to allow the head 94 to discharge ink droplets onto the stopped sheet 83 to record a single line. After the sheet 83 is conveyed by a predetermined amount, a next line is recorded. Upon receiving a recording end signal or a signal indicating that a trailing edge of the sheet 83 has reached the recording area, the recording operation is terminated and the sheet 83 is ejected.

Further, a recovery unit 117 to recover discharge failure of the recording head 94 is disposed at a right end side in the moving direction of the carriage 93 and outside the recording area. The recovery unit 117 includes a cap, a suction means, and a cleaner. In the standby time, the carriage 93 moves to the recovery unit 117, where the recording head 94 is capped by the cap, so that the discharging port of the recording head 94 is kept moisturized and discharge failure due to ink drying can be prevented. In addition, by discharging unnecessary ink for recording during operation, ink viscosity of all discharging ports is kept constant, thereby maintaining stable discharging performance.

When discharge failure occurs, the discharging port or the nozzle of the recording head 94 is sealed by the cap, and the suction means sucks ink and bubbles from the nozzle. With this operation, the ink and dust adhered around the discharging port are removed by the cleaner and discharging failure is recovered. The sucked ink is discharged in a waste ink reservoir disposed at a bottom of the apparatus, and is absorbed by an ink absorber material disposed inside the waste ink reservoir.

Thus, in the present inkjet recording apparatus, because the inkjet head to which the present embodiment is applied is mounted, nozzle clogging or adherence of solid material onto the nozzle surface is not observed. Accordingly, there is no ink droplet discharging failure and stable ink droplet discharging property can be obtained, thereby improving the image quality.

As described above, because the mage forming apparatus includes the recording head formed of the liquid droplet discharge head according to the present embodiment of the invention, a compact size apparatus with a low cost can be obtained. Further, because the number of nozzles having the same discharging head size that can discharge ink droplet can be increased, a higher speed printing is possible.

In the above-described embodiments, a case in which the image forming apparatus is a printer will be described; however, the present embodiment can be applied to copiers, facsimile machines, and other types of image forming apparatuses such as multifunction apparatuses, other than the printer. In addition, the present embodiment can be applied to the electromechanical transducer element such as the piezoelectric element 16 that constructs the liquid droplet discharge head of the image forming apparatus employing recording liquids or fixation treatment liquids other than ink. Further, the image forming apparatus includes, otherwise limited in particular, any of a serial-type image forming apparatus and a line-type image forming apparatus.

In addition, the present embodiment may be applied to the electromechanical transducer element that constructs the liquid droplet discharge head of the droplet discharge apparatus other than the image forming apparatus. For example, the present embodiment may be applied to various media to which liquid droplets for image formation are impacted is other than a piece of paper or sheet, such as thread, fiber, fabric, leather, metals, plastics, glass, wood, ceramics, and the like. The present embodiment can be applied to a case in which forming images with letters or figures having meaning to the medium, but also forming images without meaning such as patterns to the medium (and simply impacting the droplets to the medium). The present embodiment can be applied to a device in which a liquid resist for patterning is discharged and impacted on a target medium. The present embodiment can be applied to a liquid droplet discharge device in which gene analysis samples are discharged and impacted on a target medium, and to a liquid droplet discharge device for three-dimensional modeling.

The aforementioned embodiments are examples and specific effects can be obtained for each of the following aspects of (A) to (L):

<Aspect A>

A method of producing an electromechanical transducer element includes a step of forming a first electrode such as the common electrode 161 on a substrate 14 or on an undercoat layer, forming an electromechanical transducer film such as the piezoelectric film 162 on the first electrode, forming a second electrode such as an individual electrode 163 on the electromechanical transducer film, and a first protective film such as the first insulation protective film 17 that protects an upper surface of the second electrode, the electromechanical transducer film, and a side wall of the second electrode, further includes a step of selectively forming a second protective film such as the second insulation protective film 18 on a portion protecting the electromechanical transducer film and the side wall of the second electrode among the first protective film.

Conventionally, there have been problems in resist pattern formation and the etching process during post-processing after formation of the protective film on the electromechanical transducer element. More specifically, when forming the resist pattern as a post-process, because a taper angle of the side wall relative to an upper surface of the electromechanical transducer element is large, the resist film of the side wall tends to be thinner. Accordingly, the etching tolerance of the resist film is reduced and the protective film, which should remain on the side wall of the electromechanical transducer film, is excessively etched and is eliminated due to the excessive etching, risking damage to the crystals of the electromechanical transducer film in a gaseous atmosphere.

In addition, when forming a protective film on the electromechanical transducer element, as the film becomes thicker, the amount of deformation of the electromechanical transducer element is reduced. In particular, if the protective film that is formed on the upper surface of the electromechanical transducer element is especially thick, the amount of deformation of the electromechanical transducer element is apt to be reduced. Thus, in forming the protective film, sufficient deformability of the electromechanical transducer element needs to be maintained.

By contrast, according to the present aspect A, as described in the above embodiment, after the first protective film has been formed, the second protective film is further formed on a portion that protects the side wall of the electromechanical transducer film among the first protective film. With this structure, the thickness of the protective film of the portion that protects the side wall of the electromechanical transducer film can be made thicker. Accordingly, when resist pattern formation or etching process is performed as a post-process after formation of the protective film on the electromechanical transducer element, an excessive etching of the protective film resulting in elimination of the film that is desired to remain on the side wall of the electromechanical transducer film is prevented.

Moreover, the second protective film is selectively formed on a portion that protects the side wall of the electromechanical transducer film among the first protective film, and is not formed on an upper surface of the second electrode of the electromechanical transducer element, because the upper surface of the second electrode adversely affects the amount of deformation of the electromechanical transducer element. Accordingly, when forming the first protective film to protect the upper surface of the second electrode, the electromechanical transducer film, and the side wall of the second electrode, differently from forming the first protective film entirely thicker, reduction of the amount of deformation of the electromechanical transducer element due to the protective film can be prevented.

As a result, the reduction of the amount of deformation of the electromechanical transducer element due to the protective film can be prevented, and damage of the electromechanical transducer film due to the excessive etching of the protective film that protects the side wall of the electromechanical transducer film can be prevented.

<Aspect B>

In the above aspect A, a second protective film is formed as an interlayer film.

With this structure, a second protective film can be prepared in a process forming the interlayer film, without adding a new process, the second protective film can be formed. Accordingly, degradation of the production performance and increase in the production cost can be prevented.

<Aspect C>

In the above aspect A or B, the second protective film is an $SiO_2$ film.

Because the film formed of $SiO_2$ is not apt to be etched easily, the excessive etching of the protective film that protects the side wall of the electromechanical transducer film can be more securely prevented.

<Aspect D>

In any one of the above aspects A to C, the thickness of the second protective film ranges from 10 [nm] to 500 [nm].

With this structure, the etching tolerance of the second protective film is secured, the excessive etching of the protective film that protects the side wall of the electromechanical transducer film is securely prevented, and the function of the electromechanical transducer element as an actuator can be exerted.

<Aspect E>

In any of the above aspects A to D, the first protective film is formed by the atomic layer deposition (ALD) method.

With this structure, the first protective film with an excellent coverage can be formed.

<Aspect F>

In any of the above aspects A to E, the first protective film is formed of $Al_2O_3$.

With this structure, the first protective film with an excellent moisture permeability can be formed.

<Aspect G>

In any of the aspects A to F, the thickness of the first protective film ranges from 30 [nm] to 80 [nm].

With this structure, the protection function of the barrier function of the first protective film can be fully secured, and the function of the electromechanical transducer element as an actuator can be exerted.

<Aspect H>

In any of the aspects A to G, a taper angle formed between the substrate 14 or the surface of the undercoat layer and a side wall of the second insulation protective film 18 is smaller than that formed between the substrate or the surface of the undercoat layer and the side wall of the electromechanical transducer film.

With this structure, a concentration of stress at lateral ends of the electromechanical transducer element is moderated, thereby making the lifetime longer and improving the reliability.

<Aspect I>

The electromechanical transducer element is obtained by any one of the methods of producing among the aspects A to H for the electromechanical transducer element.

With this structure, the electromechanical transducer element without any damage to the electromechanical transducer film or film floating.

<Aspect J>

The liquid droplet discharge head such as the liquid droplet discharge section 10 includes the nozzle 11 to discharge liquid droplets, the liquid chamber 13 to which the nozzle 11 communicates, and a pressure generating means to generate pressure to be applied to the liquid inside the liquid chamber 13, and further includes the diaphragm 15 that forms part of the wall of the liquid chamber 13, and the electromechanical transducer element according to the above aspect I disposed on the diaphragm 15.

With this structure, the electromechanical transducer element without any damage to the electromechanical transducer film or film floating applies pressure to the liquid inside the liquid chamber 13, so that a stable liquid droplet discharge property can be obtained.

<Aspect K>

In the aspect J, the electromechanical transducer film constructing the electromechanical transducer element disposed on diaphragm 15 is disposed at an internal side of the position of the wall forming the liquid chamber 13.

With this structure, the diaphragm 15 can obtain sufficient transformation or surface displacement, and a more stable droplet discharge property can be obtained.

<Aspect L>

An image forming apparatus includes a liquid droplet discharge head as an ink droplet discharge apparatus according to the above aspect J or K.

With this structure, a more stable droplet discharge property can be obtained, so that a high-quality image can be formed.

Additional modifications and variations of the present invention are possible in light of the above teachings. It is therefore to be understood that, within the scope of the appended claims, the invention may be practiced other than as specifically described herein.

What is claimed is:

1. A method of producing an electromechanical transducer element, the method comprising:
   forming a first electrode on one of a substrate and an undercoat layer;
   forming an electromechanical transducer film on the first electrode;
   forming a second electrode on the electromechanical transducer film;
   forming a first protective film including:
      a first upper portion on an upper surface of the second electrode,
      a side-wall portion on a side of the electromechanical transducer film, and
      a second upper portion on an upper surface of the electromechanical transducer film and on a side of the second electrode, and
   forming a second protective film so that an entire length of the second protective film is along a plane that is parallel to the side-wall portion of the first protective film.

2. The method as claimed in claim 1, wherein the second protective film is an interlayer film.

3. The method as claimed in claim 1, wherein the second protective film is an $SiO_2$ film.

4. The method as claimed in claim 1, wherein a thickness of the second protective film is in a range from 10 [nm] to 500 [nm].

5. The method as claimed in claim 1, wherein the first protective film is formed by atomic layer deposition (ALD).

6. The method as claimed in claim 1, wherein the first protective film is formed of $Al_2O_3$.

7. The method as claimed in claim 1, wherein thickness of the first protective film is in a range from 30 [nm] to 80 [nm].

8. The method as claimed in claim 1, wherein a taper angle formed between the substrate and a side wall of the second protective film is smaller than a taper angle formed between the substrate and a side wall of the electromechanical transducer film.

9. An electromechanical transducer element produced by the method of producing the electromechanical transducer element as claimed in claim 1.

10. A liquid droplet discharge head, comprising:
    a nozzle to discharge liquid droplets;
    a liquid chamber to which the nozzle communicates; and
    a pressure generator to generate pressure that is applied to liquid inside the liquid chamber, the pressure generator including:
    a diaphragm that forms part of a wall of the liquid chamber; and
    an electromechanical transducer element disposed on the diaphragm, the electromechanical transducer element comprising:
       a first electrode on one of a substrate and an undercoat layer;
       an electromechanical transducer film on the first electrode;
       a second electrode on the electromechanical transducer film;
       a first protective film including a first upper portion on an upper surface of the second electrode, a side-wall portion on a side of the electromechanical transducer film, and a second upper portion on an upper surface of the electromechanical transducer film and on a side of the second electrode, and
       a second protective film in which an entire length of the second protective film is oriented along a plane that is parallel to the side-wall portion of the first protective film.

11. The liquid droplet discharge head as claimed in claim 10, wherein the electromechanical transducer film is disposed at an internal side of a position of the wall of the liquid chamber.

12. An image forming apparatus, comprising:
    an apparatus body;
    a carriage movable in a main scanning direction; and
    a recording head mounted on the carriage and according to claim 10.

13. An electromechanical transducer element, comprising:
    a first electrode on one of a substrate and an undercoat layer;
    an electromechanical transducer film on the first electrode;
    a second electrode on the electromechanical transducer film;
    a first protective film including a first upper portion on an upper surface of the second electrode, a side-wall portion on a side of the electromechanical transducer film, and a second upper portion on an upper surface of the electromechanical transducer film and on a side of the second electrode, and a second protective film in which an entire length of the second protective film is oriented along a plane that is parallel to the side-wall portion of the first protective film.

14. The electromechanical transducer element according to claim 13, wherein the second protective film is an interlayer film.

15. The electromechanical transducer element according to claim 13, wherein the second protective film is an $SiO_2$ film.

16. The electromechanical transducer element according to claim 13, wherein a thickness of the second protective film is in a range from 10 [nm] to 500 [nm].

17. The electromechanical transducer element according to claim 13, wherein the first protective film is formed by atomic layer deposition (ALD).

18. The electromechanical transducer element according to claim 13, wherein the first protective film is formed of $Al_2O_3$.

19. The electromechanical transducer element according to claim 13, wherein thickness of the first protective film is in a range from 30 [nm] to 80 [nm].

20. The electromechanical transducer element according to claim 13, wherein a taper angle formed between the substrate and a side wall of the second protective film is smaller than a taper angle formed between the substrate and a side wall of the electromechanical transducer film.

* * * * *